(12) United States Patent
Takahashi (10) Patent No.: US 6,742,250 B2
(45) Date of Patent: Jun. 1, 2004

(54) METHOD OF MANUFACTURING WIRING SUBSTRATE

(75) Inventor: Kazuyuki Takahashi, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 155 days.

(21) Appl. No.: 10/180,097

(22) Filed: Jun. 27, 2002

(65) Prior Publication Data

US 2003/0000083 A1 Jan. 2, 2003

(30) Foreign Application Priority Data

Jun. 27, 2001 (JP) ........................................ 2001-195110

(51) Int. Cl.[7] ................................................ H05K 3/02
(52) U.S. Cl. ............................ 29/847; 29/840; 29/846; 174/255
(58) Field of Search ........................ 29/847, 846, 840; 174/255

(56) References Cited

U.S. PATENT DOCUMENTS 5,832,563 A * 11/1998 Simpson .................... 16/110.1
6,042,929 A * 3/2000 Burke et al. ................ 428/141
6,534,723 B1 * 3/2003 Asai et al. .................. 174/255
6,630,743 B2 * 10/2003 Magnuson et al. ......... 257/774

FOREIGN PATENT DOCUMENTS

| JP | 10-86433 | * | 4/1998 |
| JP | 11-307915 | | 11/1999 |
| JP | 2000-59009 | | 2/2000 |

* cited by examiner

*Primary Examiner*—Carl J. Arbes
(74) *Attorney, Agent, or Firm*—Sughrue Mion, PLLC (57) ABSTRACT

A method for manufacturing a wiring substrate 1 includes a conductor layer forming step for forming a second conductor layer 29, through electroless copper plating and copper electroplating, on a first resin dielectric layer 7, which is surface-roughened to a predetermined roughness and to which palladium adheres; a cyan treatment step for cleaning a substrate 41 on which the second conductor layer 29 is formed, using a cyanide-containing solution; and an upper resin dielectric layer forming step for forming a second resin dielectric layer 9 on the first resin dielectric layer 7 and the second conductor layer 29 of the cyan-treated substrate 41.

11 Claims, 9 Drawing Sheets

METHOD OF MANUFACTURING WIRING SUBSTRATE

BACKGROUND OF THE INVENTION

1. Field of the Invention

The present invention relates to a method for manufacturing a wiring substrate configured such that a conductor layer of a predetermined pattern is formed on a resin dielectric layer, and an upper resin dielectric layer is formed on the resin dielectric layer and on the conductor layer, and more particularly to a method for manufacturing a wiring substrate configured such that a conductor layer is formed through copper plating on a resin dielectric layer whose surface has been roughened to a predetermined roughness and to which palladium adheres.

2. Description of the Related Art

Conventionally, a wiring substrate has been known configured such that a conductor layer of a predetermined pattern is formed on a surface-roughened resin dielectric layer, and an upper resin dielectric layer is formed on the resin dielectric layer and on the conductor layer.

Figure 6:
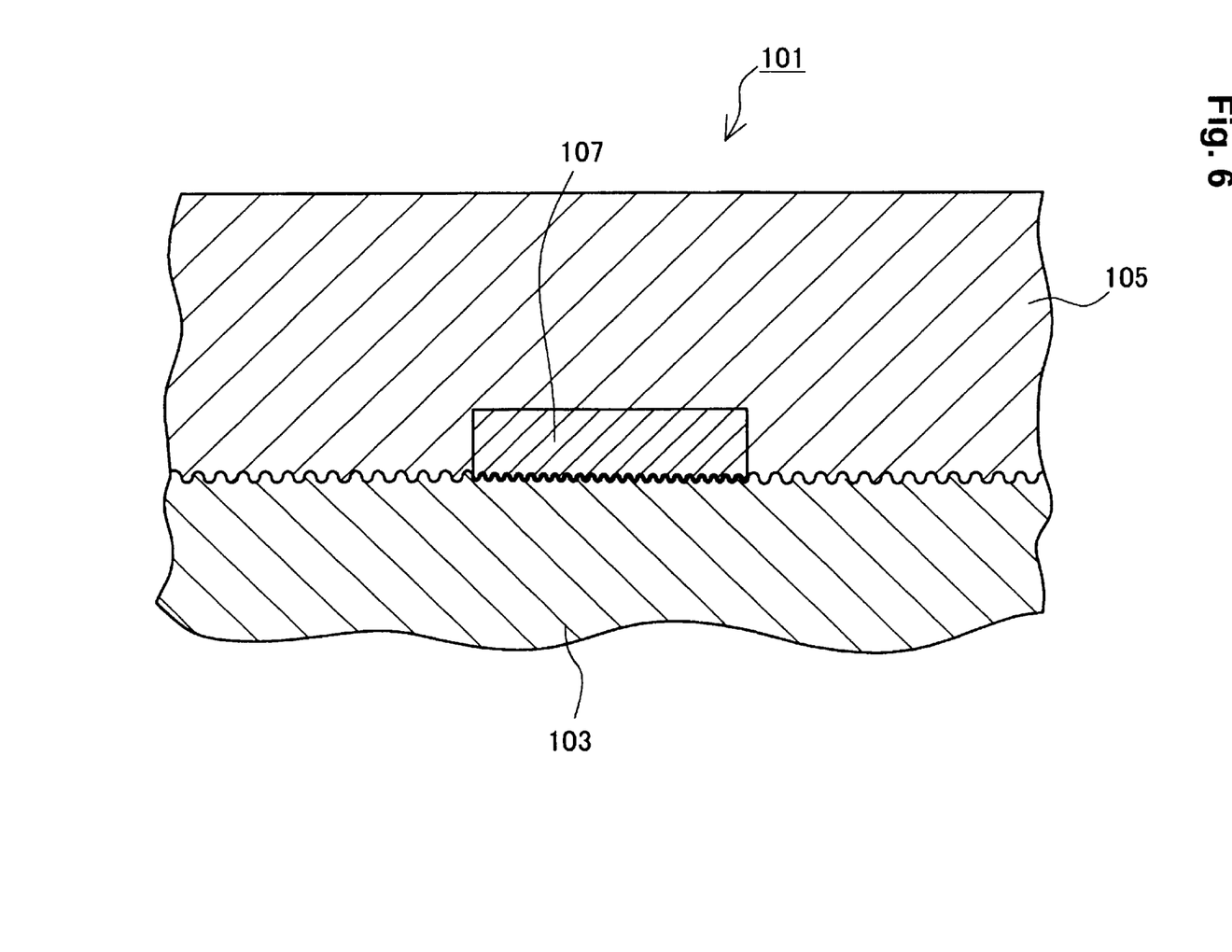
FIG. 6 is a partial, enlarged sectional view of a conventional wiring substrate.

An example of such a wiring substrate is a wiring substrate 101, which is schematically shown in the partial, enlarged sectional view of FIG. 6. The wiring substrate 101 includes a surface-roughened resin dielectric layer 103. A conductor layer 107 of a predetermined pattern, which includes wiring and pads, is formed on the resin dielectric layer 103 through electroless copper plating and copper electroplating. An upper resin dielectric layer 105 is formed on the resin dielectric layer 103 and on the conductor layer 107.

The wiring substrate 101 is manufactured, for example, in the following manner. A substrate 111 having the resin dielectric layer 103 is prepared. The surface of the resin dielectric layer 103 is roughened to a predetermined roughness by etching (see FIG. 7) for the purpose of enhancing bonding strength between the resin dielectric layer 103, and the conductor layer 107 or the upper resin dielectric layer 105, which are to be formed on the resin dielectric layer 103.

Figure 7:
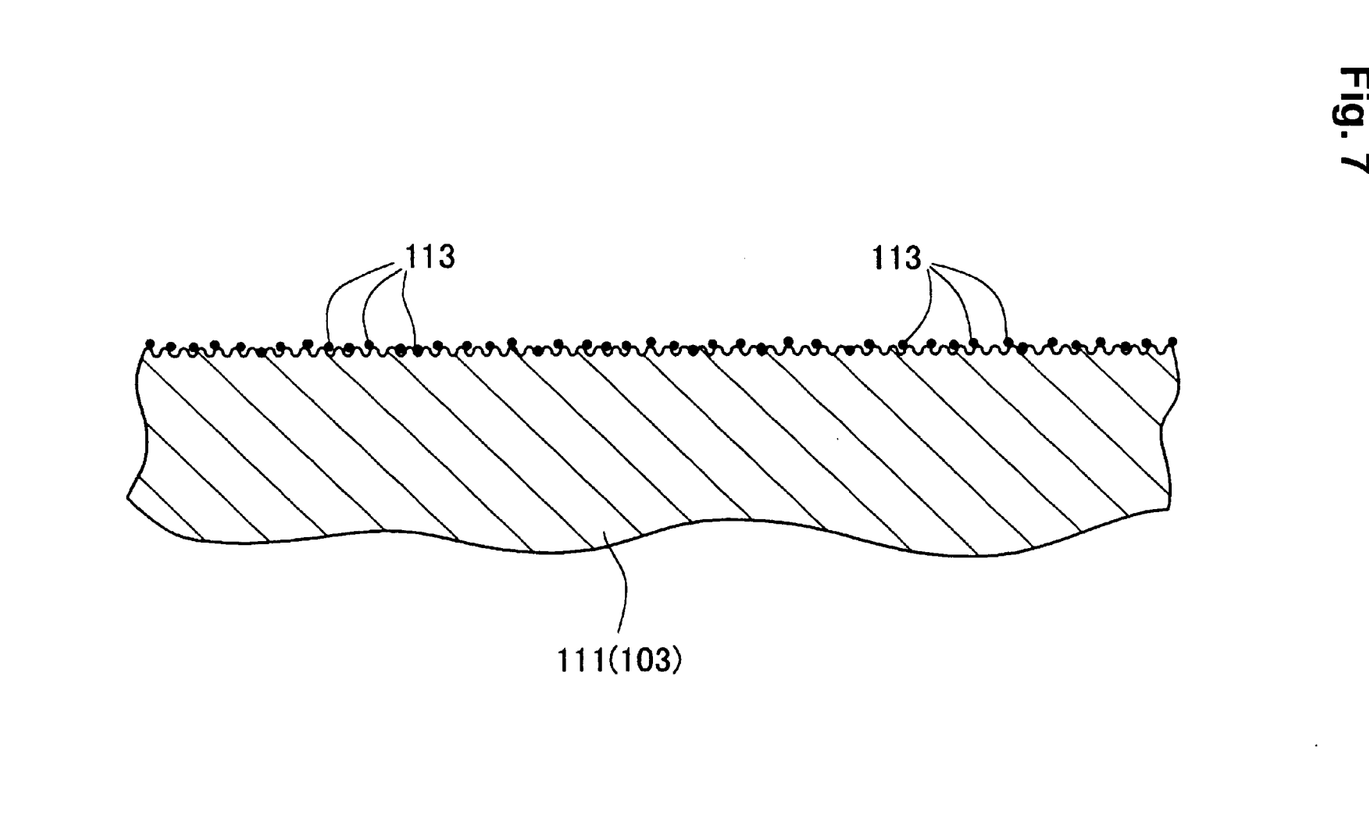
FIG. 7 is an explanatory view relating to a method for manufacturing the conventional wiring substrate and showing adhesion of palladium to a surface-roughened resin dielectric layer.

Subsequently, as shown in FIG. 7, palladium 113, which serves as a catalytic metal in the course of formation of an electroless copper plating layer, is formed on the roughened surface of the resin dielectric layer 103.

Figure 8:
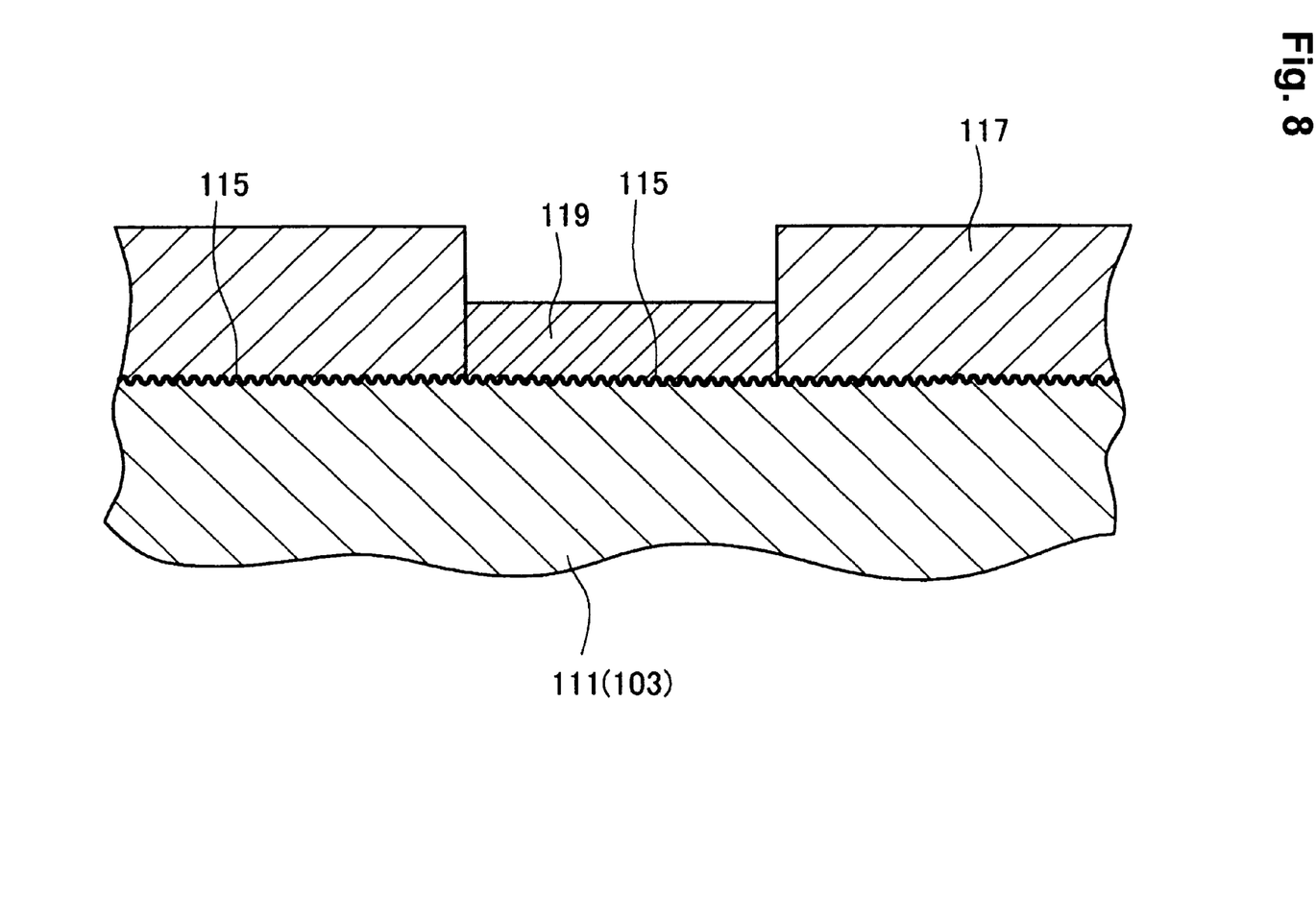
FIG. 8 is an explanatory view relating to the method for manufacturing the conventional wiring substrate and showing the state after formation of a copper electroplating layer on an electroless copper plating layer exposed through a plating resist layer.

Next, the substrate 111 to which palladium 113 adheres is subjected to electroless copper plating, thereby forming an electroless copper plating layer 115, as represented by the thick line in FIG. 8, on substantially the entire surface of the resin dielectric layer 103.

The substrate 111 on which the electroless copper plating layer 115 has been formed is heated at 120° C. for 60 minutes for the purpose of, for example, drying the wet substrate 111 and enhancing bonding strength between the resin dielectric layer 103 and the electroless copper plating layer 115.

Subsequently, a plating resist layer 117 is formed in a predetermined pattern on the electroless copper plating layer 115 (see FIG. 8).

Subsequently, the substrate 111 on which a plating resist layer 117 has been formed is subjected to copper electroplating, thereby forming a copper electroplating layer 119 on the electroless copper plating layer 115 exposed through the plating resist layer 117 as shown in FIG. 8.

Next, the plating resist layer 117 is removed.

Subsequently, the substrate 111, from which the plating resist layer 117 has been removed, is heated at 150° C. for 120 minutes to enhance bonding between the resin dielectric layer 103 and the electroless copper plating layer 115 and between the electroless copper plating layer 115 and the copper electroplating layer 119.

Figure 9:
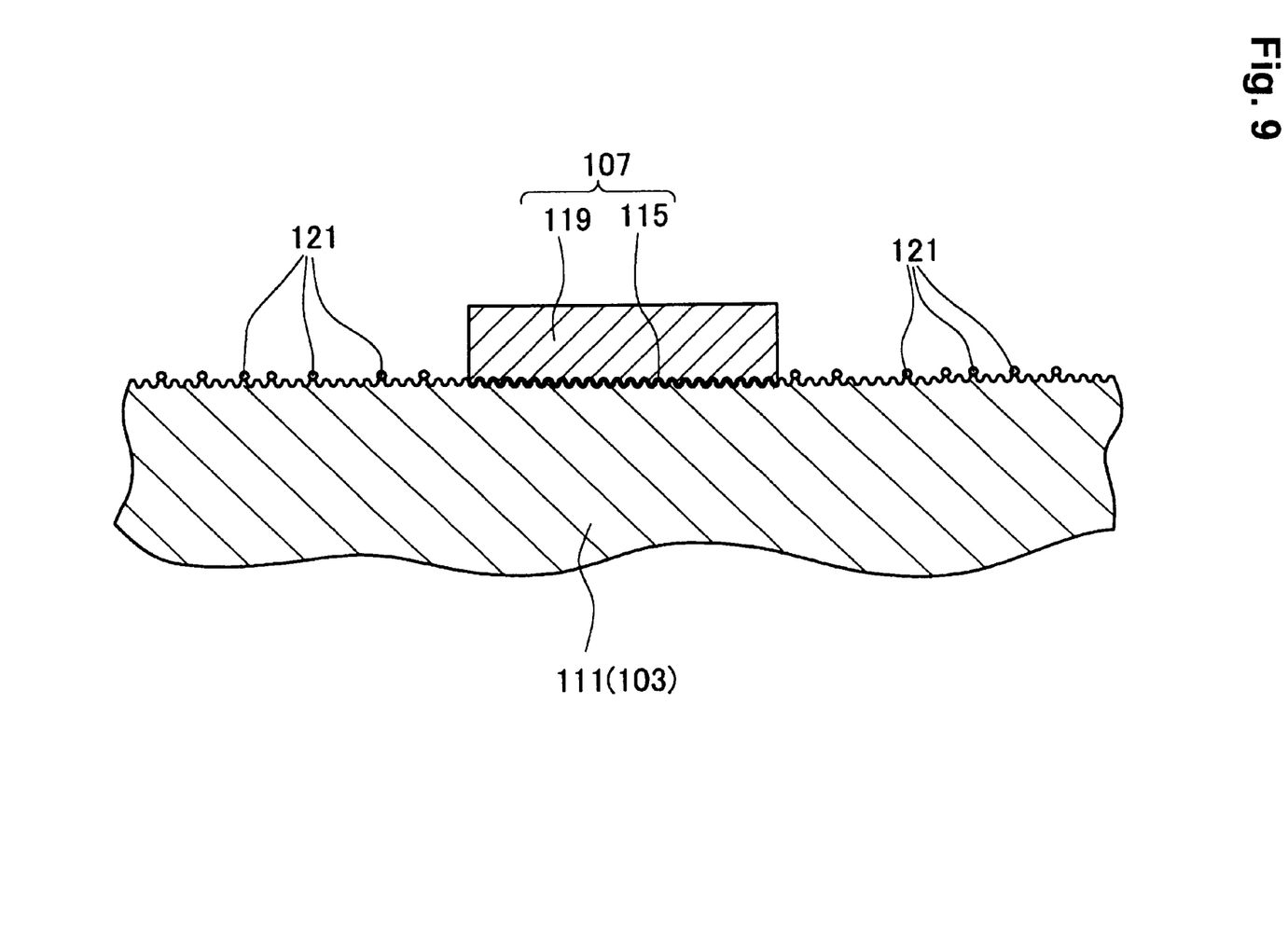
FIG. 9 is an explanatory view relating to the method for manufacturing the conventional wiring substrate and showing the state after etching-away of the electroless copper plating layer (except where the same is overlaid with the copper electroplating layer).

Subsequently, as shown in FIG. 9, the electroless copper plating layer 115 is etched away, except where the same is overlaid with the copper electroplating layer 119, thereby forming the conductor layer 107 in a predetermined pattern. In this case, a metallic residue 121 of the palladium 113 and copper may be present on a portion (hereinafter also called "an exposed portion") of the resin dielectric layer 103 which is exposed through the conductor layer 107, such as through spaces between conductor lines.

Then, the substrate 111 is cleaned using a permanganic acid solution, thereby completely removing the metallic residue 121 from the exposed portion of the resin dielectric layer 103.

Subsequently, the upper resin dielectric layer 105 is formed on the resin dielectric layer 103 and on the conductor layer 107, thereby completing the wiring substrate 101 shown in FIG. 6.

3. Problems to be Solved by the Invention

However, permanganic acid treatment for removing the metallic residue 121 is adapted to melt the surface of the resin dielectric layer 103 so as to remove the metallic residue 121 together with resin. Therefore, the treatment roughens the surface of the resin dielectric layer 103 (see FIG. 6), to thereby impair bonding strength between the resin dielectric layer 103 and the upper resin dielectric layer 105.

If permanganic acid treatment is not performed, the upper resin dielectric layer 105 is formed while the metallic residue 121 of the palladium 113 and copper is present on the exposed portion of the resin dielectric layer 103, potentially raising a problem such as a short circuit in the wiring substrate 101 or a reduction in insulation resistance.

The present invention has been accomplished in view of the foregoing, and an object of the present invention is to provide a method for manufacturing a wiring substrate, wherein a conductor layer of a predetermined pattern is formed, through copper plating, on a resin dielectric layer having a roughened surface to which palladium adheres, and an upper resin dielectric layer is formed on the resin dielectric layer and the conductor layer. The method can remove residual substances such as palladium from an exposed portion of the resin dielectric layer, and can establish reliable bonding strength between the resin dielectric layer and the upper resin dielectric layer.

The above object of the present invention has been achieved by providing a method for manufacturing a wiring substrate including a resin dielectric layer, a conductor layer of a predetermined pattern formed on the resin dielectric layer, and an upper resin dielectric layer formed on the resin dielectric layer and on the conductor layer, comprising: a conductor layer forming step of forming the conductor layer, through electroless copper plating and copper electroplating, on the resin dielectric layer of the substrate, the resin dielectric layer having a surface which has been surface-roughened to a predetermined roughness and to which palladium adheres; a cyan treatment step of cleaning the substrate, on which the conductor layer has been formed, using a cyanide-containing solution; and an upper resin dielectric layer forming step of forming an upper resin dielectric layer on the resin dielectric layer and the conductor layer of the cyan-treated substrate.

As mentioned previously, if permanganic acid treatment is used to remove an adhering metallic residue of palladium and copper from a portion (hereinafter also called "an exposed portion") of the resin dielectric layer which is exposed through the conductor layer, such as through spaces between conductor lines, the resin dielectric layer is also roughened. This results in impaired bonding strength between the resin dielectric layer and the upper resin dielectric layer.

By contrast, the present invention employs a cyan treatment in place of permanganic acid treatment; i.e., the substrate is cleaned using a cyanide-containing solution. Cleaning with a cyanide-containing solution can remove a metallic residue of palladium and copper without roughening the resin dielectric layer, thereby preventing a problem such as a short circuit in the wiring substrate or a reduction in insulation resistance, while establishing reliable bonding strength between the resin dielectric layer and the upper resin dielectric layer.

A cyanide-containing solution is an aqueous solution of an inorganic cyanide compound such as potassium cyanide or sodium cyanide, or a solution containing an inorganic cyanide compound serving as a predominant component and additives such as an oxidizing agent and a pH adjusting agent.

Preferably, in the cyan treatment step, the substrate is cleaned a plurality of times using the cyanide-containing solution, and dried between cleanings.

According to the present invention, after the substrate is cleaned with the cyanide-containing solution, the substrate is dried and is then cleaned again with a cyanide-containing solution. If needed, this cleaning-and-drying step is repeated. By cleaning the substrate repeatedly with an intermediate drying step, an adhering metallic residue of palladium and copper can be more reliably removed from an exposed portion of the resin dielectric layer as compared with the case where the substrate is cleaned for a long period of time without intermediate drying, thereby more reliably preventing a problem such as a short circuit in the wiring substrate.

Preferably, the substrate is maintained at a temperature not higher than about 85° C. in the course of working ranging from the conductor layer forming step to the cyan treatment step.

As mentioned previously, the conventional manufacturing method heats the substrate twice at high temperature in the course of working ranging from the conductor layer forming step to the cyan treatment step. Specifically, after electroless copper plating is performed, the substrate is heated at about 120° C. for 60 minutes; and after the plating resist layer is removed, the substrate is heated at about 150° C. for 120 minutes. These heat treatment steps are adapted to enhance bonding between the resin dielectric layer and the electroless copper plating layer, and between the electroless copper plating layer and the copper electroplating layer. However, enhancement of bonding between the resin dielectric layer and the electroless copper plating layer fosters the tendency toward the presence of a metallic residue of palladium and copper on an exposed portion of the resin dielectric layer in the step of forming the conductor layer. Since such metallic residue adheres to the resin dielectric layer with a relatively strong force, reliable removal of the metallic residue by cyan treatment may become difficult.

By contrast, according to the present invention, the substrate is maintained at a temperature not higher than about 85° C. in the course of working ranging from the conductor layer forming step to the cyan treatment step; i.e., over a span of working between adhesion of palladium to the resin dielectric layer and cleaning of the substrate with a cyanide-containing solution. Thus, in the step of forming the conductor layer, the amount of a metallic residue of palladium and copper present on an exposed portion of the resin dielectric layer is small. Further, strength of adhesion of the metallic residue to the resin dielectric layer is rather low. Therefore, in the cyan treatment step, the metallic residue can be more reliably removed from the exposed portion, thereby more reliably preventing a problem such as a short circuit in the wiring substrate.

Preferably, the above-described method for manufacturing a wiring substrate further comprises a heat treatment step conducted after the cyan treatment step and before the upper resin dielectric layer forming step, for heating the cyan-treated substrate to a temperature higher than about 85° C.

According to the present invention, after cyan treatment, the substrate is subjected to heat treatment for heating the substrate at a temperature higher than about 85° C., thereby enhancing bonding between the resin dielectric layer and the electroless copper plating layer, and between the electroless copper plating layer and the copper electroplating layer. Since this heat treatment is carried out after cyan treatment, the tendency toward presence of a metallic residue of palladium and copper on an exposed portion of the resin dielectric layer, and the difficulty in removing the metallic residue can both be avoided, which would otherwise occur if heat treatment were carried out prior to cyan treatment.

Preferably, the above-described method for manufacturing a wiring substrate further comprises conducting a conductor roughening step after the heat treatment step and before the upper resin dielectric layer forming step, for roughening the surface of the conductor layer.

In some cases, in order to enhance bonding strength between the conductor layer and the upper resin dielectric layer, the surface of the conductor layer may be roughened. If surface-roughening of the conductor layer is performed before the heat treatment step, the surface of the conductor layer may fail to be roughened to a predetermined roughness.

According to the present invention, after heat treatment, the surface of the conductor layer is roughened. Since the conductor layer is softened (modified) by heating, the surface of the conductor layer can be reliably roughened to a predetermined roughness, whereby bonding strength between the conductor layer and the upper resin dielectric layer can be enhanced.

The present invention provides another method for manufacturing a wiring substrate including a resin dielectric layer, a conductor layer formed in a predetermined pattern on the resin dielectric layer, and an upper resin dielectric layer formed on the resin dielectric layer and on the conductor layer, comprising: an electroless copper plating step of forming an electroless copper plating layer, through electroless copper plating, on the resin dielectric layer of the substrate, the resin dielectric layer having a surface which has been surface-roughened to a predetermined roughness and to which palladium adheres; a drying step of drying the substrate on which the electroless copper plating layer has been formed, at a temperature not higher than about 85° C.; a plating resist layer forming step of forming, after the drying step, a plating resist layer of a predetermined pattern on the electroless copper plating layer; a copper electroplating step of forming a copper electroplating layer, through copper electroplating, on the electroless copper plating layer exposed through the plating resist layer; a plating resist layer removing step of removing, after the copper electroplating step, the plating resist layer; an etching-away step of etching away the electroless copper plating layer except where the same is overlaid with the copper electroplating layer, thereby forming the conductor layer; a cyan treatment step of cleaning the substrate, on which the conductor layer has been formed, using a cyanide-containing solution; and an upper resin dielectric layer forming step of forming an upper resin dielectric layer on the resin dielectric layer and the conductor layer of the cyan-treated substrate.

According to the present invention, after an exposed portion of the electroless copper plating layer is etched away, in place of conventionally practiced permanganic acid treatment, cyan treatment is performed for cleaning the substrate using a cyanide-containing solution. Cleaning with a cyanide-containing solution can remove a metallic residue of palladium and copper without roughening the resin dielectric layer, thereby preventing a problem such as a short circuit in the wiring substrate or a reduction in insulation resistance and establishing reliable bonding strength between the resin dielectric layer and the upper resin dielectric layer.

The present invention replaces the conventional step of heating, after electroless copper plating, the substrate at high temperature (at 120° C. for 60 minutes) with the step of heating the substrate at a relatively low temperature not higher than about 85° C. for drying the substrate. Therefore, the resin dielectric layer and the electroless copper plating layer are bonded with rather low strength. Thus, in the etching-away step, removal of the electroless copper plating layer and palladium is facilitated, thereby reducing the amount of a metallic residue of palladium and copper remaining on an exposed portion of the resin dielectric layer. In the subsequent cyan treatment step, removal of the metallic residue remaining on the exposed portion is facilitated, thereby more reliably preventing a problem such as a short circuit in the wiring substrate.

Preferably, in the cyan treatment step, the substrate is cleaned a plurality of times using the cyanide-containing solution and dried between cleanings.

According to the present invention, after the substrate is cleaned using a cyanide-containing solution, the substrate is dried and is then cleaned again using the cyanide-containing solution. If needed, this cleaning-and-drying step is repeated. By cleaning the substrate repeatedly using a cyanide-containing solution with an intermediate drying step, an adhering metallic residue of palladium and copper can be more reliably removed from an exposed portion of the resin dielectric layer as compared with the case where the substrate is cleaned for a long period of time without intermediate drying, thereby more reliably preventing a problem such as a short circuit in the wiring substrate.

Preferably, the above-described method for manufacturing a wiring substrate further comprises conducting a heat treatment step after the cyan treatment step and before the upper resin dielectric layer forming step, for heating the cyan-treated substrate to a temperature higher than about 85° C.

According to the present invention, the substrate is subjected to heat treatment for heating the substrate at a temperature higher than about 85° C., thereby enhancing bonding between the resin dielectric layer and the electroless copper plating layer, and between the electroless copper plating layer and the copper electroplating layer. Since this heat treatment is carried out after cyan treatment, the tendency toward presence of a metallic residue of palladium and copper on an exposed portion of the resin dielectric layer, and the difficulty in removing the metallic residue can both be avoided, which would otherwise occur if heat treatment were carried out prior to cyan treatment.

Preferably, the above-described method for manufacturing a wiring substrate further comprises conducting a conductor roughening after the heat treatment step and before the upper resin dielectric layer forming step, for roughening the surface of the conductor layer.

If the conductor roughening step for enhancing bonding strength between the conductor layer and the upper resin dielectric layer is performed before the heat treatment step, the surface of the conductor layer may fail to be roughened to a predetermined roughness.

According to the present invention, after heat treatment, the surface of the conductor layer is roughened. Since the conductor layer is softened (modified) by heating, the surface of the conductor layer can be reliably roughened to a predetermined roughness, whereby bonding strength between the conductor layer and the upper resin dielectric layer can be enhanced.

DESCRIPTION OF REFERENCE NUMERALS

1: wiring substrate
5: core substrate
7: first resin dielectric layer

9: second resin dielectric layer
11: solder resist layer (resin dielectric layer)
27: first conductor layer
29: second conductor layer
31: third conductor layer
41: substrate
43: palladium (Pd)
45: electroless copper plating layer
47: plating resist layer
49: copper electroplating layer
51: metallic residue (of palladium and copper)

DETAILED DESCRIPTION OF THE PREFERRED EMBODIMENTS

An embodiment of the present invention will be described with reference to the drawings. However, the present invention should not be construed as being limited thereto.

Figure 1:
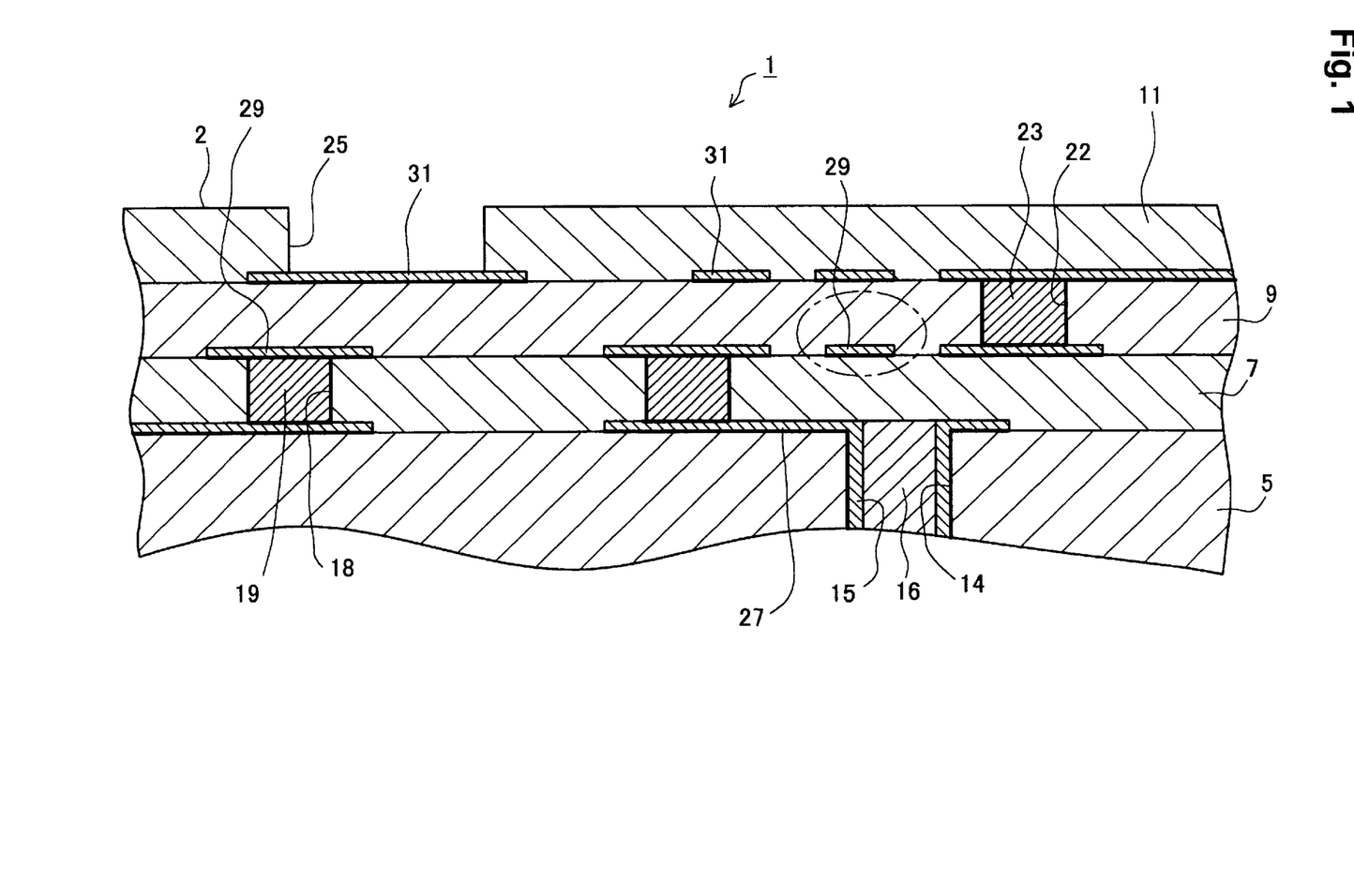
FIG. 1 is a partial, enlarged sectional view of a wiring substrate according to an embodiment of the present invention.

FIG. 1 is a partial enlarged sectional view of a wiring substrate 1 of the present embodiment, showing a portion located on the side toward a main surface 2. The wiring substrate 1 assumes a substantially square, substantially platelike shape having the main surface 2 and an unillustrated back surface and has, at its center, a substantially platelike core substrate 5 formed of a composite material of glass fiber cloth impregnated with epoxy resin. A first resin dielectric layer 7 of epoxy resin or the like is formed on each side of the core substrate 5. A second resin dielectric layer 9 of epoxy resin or the like is formed on the first resin dielectric layer 7. A solder resist layer (resin dielectric layer) 11 of epoxy resin or the like is formed on the second resin dielectric layer 9. The surface of the first resin dielectric layer 7 and that of the second resin dielectric layer 9 are roughened to a roughness Ra of about 0.45 $\mu$m, thereby enhancing bonding strength between the first resin dielectric layer 7 and the second resin dielectric layer 9, and between the second resin dielectric layer 9 and the solder resist layer 11.

The core substrate 5 has a plurality of through-holes 14 formed therein at predetermined positions so as to allow the formation of through-hole conductors. A cylindrical through-hole conductor 15 is formed on the inner circumferential surface of each through-hole 14. Each of the through-hole conductors 15 is filled with a substantially columnar plug material 16 formed of epoxy resin or the like.

The first resin dielectric layer 7 has a plurality of through-holes 18 formed therein at predetermined positions so as to allow the formation of vias. A substantially columnar filled via 19 is formed in each of the through-holes 18.

Similarly, the second resin dielectric layer 9 has a plurality of through-holes 22 formed therein at predetermined positions so as to allow the formation of vias. A substantially columnar filled via 23 is formed in each of the through-holes 22.

The solder resist layer 11 has a plurality of openings 25 formed therein at predetermined positions so as to extend through the same and expose pads.

A first conductor layer 27 including conductor lines and pads is formed in a predetermined pattern between the core substrate 5 and the first resin dielectric layer 7, and is connected to the through-hole conductors 15 formed in the core substrate 5 and the filled vias 19 formed in the first resin dielectric layer 7.

A second conductor layer 29 including conductor lines and pads is formed in a predetermined pattern between the first resin dielectric layer 7 and the second resin dielectric layer 9, and is connected to the filled vias 19 formed in the first resin dielectric layer 7 and the filled vias 23 formed in the second resin dielectric layer 9.

A third conductor layer 31 including conductor lines and pads is formed in a predetermined pattern between the second resin dielectric layer 9 and the solder resist layer 11, and is connected to the filled vias 23 formed in the second resin dielectric layer 9. Some pads of the third conductor layer 31 are exposed through the respective openings 25 formed in the solder resist layer 11, in order to allow mounting of an electronic component such as an IC chip on the wiring substrate 1. A nickel plating layer is formed on the surface of each of the pads in order to prevent oxidation, and a gold plating layer is formed on the nickel plating layer (not shown).

The first, second, and third conductor layers 27, 29, and 31 are surface-roughened to a roughness Ra of about 0.40 $\mu$m, thereby enhancing bonding strength between the first conductor layer 27 and the first resin dielectric layer 7, between the second conductor layer 29 and the second resin dielectric layer 9, and between the third conductor layer 31 and the solder resist layer 11.

Next, a method for manufacturing the above-described wiring substrate 1 will be described with reference to the drawings.

First, a substrate is prepared by a known method and configured such that the first conductor layer 27 is formed on the core substrate 5, and the first resin dielectric layer 7 is formed on the core substrate 5 and on the first conductor layer 27.

Specifically, a double-sided copper-clad core substrate 5, which is a core substrate 5 whose opposite sides are clad with copper foil, is prepared, and a plurality of through-holes 14 are formed in the core substrate 5 at predetermined positions so as to allow the formation of through-hole conductors. Then, plating layers are formed on opposite sides of the core substrate 5 so as to cover substantially the entire surface on each side, and the substantially cylindrical through-hole conductor 15 is formed on the inner circumferential surface of each of the through-holes 14. Subsequently, each of the through-hole conductors 15 is filled with the plug material 16 formed of epoxy resin or the like. Then, an etching resist layer of a predetermined pattern is formed on each of the plating layers. The plating layer exposed through the resist layer is etched away, thereby forming the first conductor layer 27 of a predetermined pattern on the core substrate 5. Subsequently, the surface of the first conductor layer 27 is roughened. Then, the first resin dielectric layer 7 having the first through-holes 18 formed therein for formation of vias is formed on, for example, the core substrate 5 and the first conductor layer 27.

Figure 2:
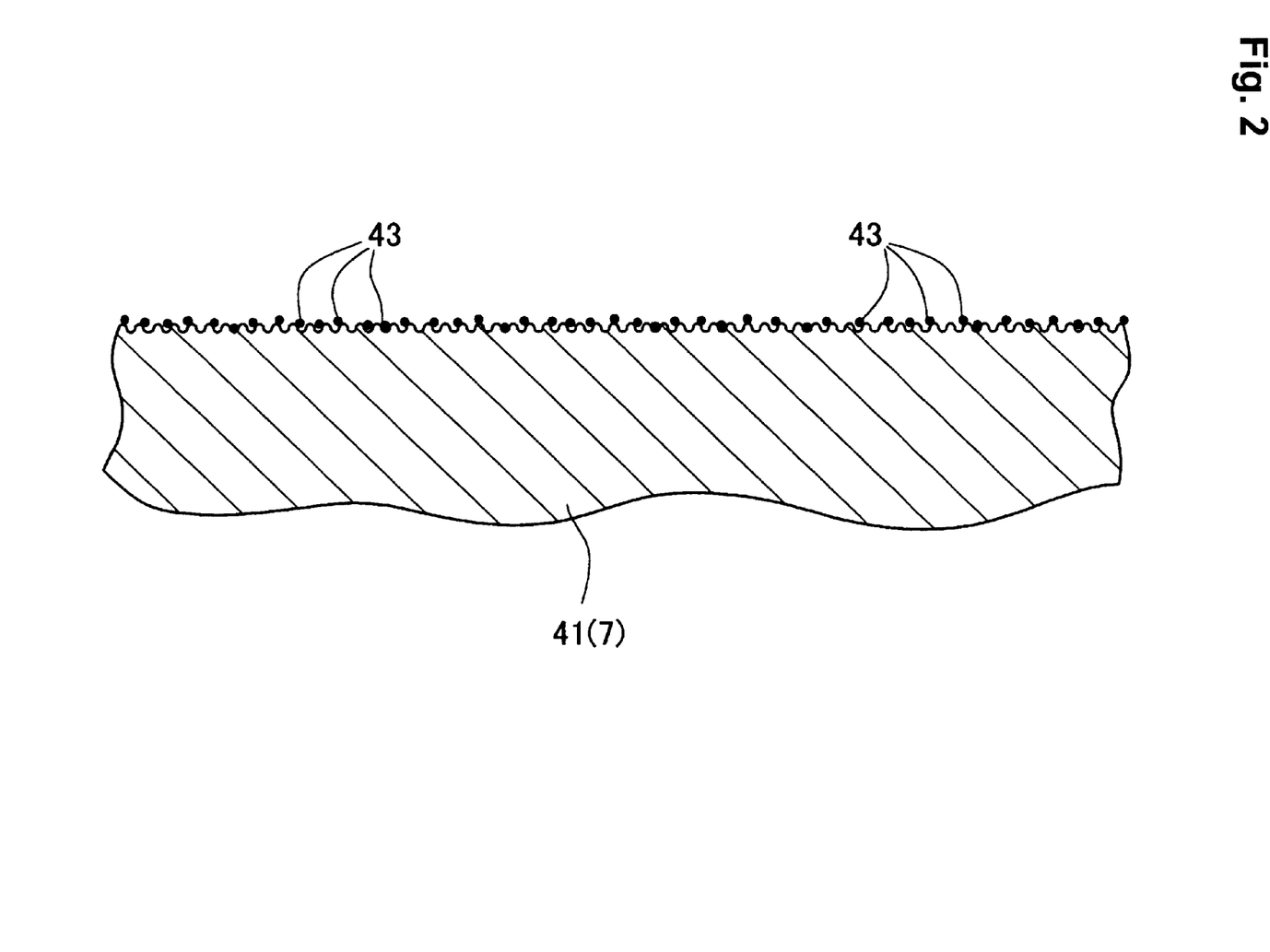
FIG. 2 is an explanatory view relating to a method for manufacturing the wiring substrate according to the embodiment and showing adhesion of palladium to a surface-roughened first resin dielectric layer.

Next, in a resin roughening step, as shown in FIG. 2 showing a surface area (a portion enclosed by the dash-and-dot line in FIG. 1) of the first resin dielectric layer 7 of the above-described substrate 41, the surface of the first resin dielectric layer 7 and the inner circumferential surfaces (not shown) of the through-holes 18 are roughened to a roughness Ra of about 0.45 $\mu$m through etching using an aqueous solution of potassium permanganate.

Specifically, the substrate 41 is treated at about 50° C. for about 5 minutes with an organic acid, for the purpose of degreasing. This treatment is performed to remove a film adhering to the surface of the resin dielectric layer 7. Subsequently, the substrate 41 is washed with water. After that, the substrate 41 is treated at about 80° C. for about 15.5 minutes using, for example, sodium hydroxide. Subsequently, the substrate 41 is washed again with water.

After that, the substrate 41 is treated at about 80° C. for about 10 minutes with an aqueous solution of potassium permanganate and sodium hydroxide. As a result, projections and depressions are formed on the surface of the resin dielectric layer 7, so that the roughness Ra becomes about 0.45 μm as described above. Subsequently, the substrate 41 is washed again using water. After that, the substrate 41 is subjected to reduction treatment performed at about 45° C. for about 5 minutes with sulfuric acid for the purpose of neutralization. Subsequently, the substrate 41 is washed again by use of water so as to further neutralize the substrate 41. Finally, the substrate 41 is dried at about 80° C. for about 16.5 minutes.

Next, in a palladium adhering step, palladium 43 is adhered to the roughened surface of the first resin dielectric layer 7 so as to serve as a catalytic metal for forming an electroless copper plating layer 45, which will be described below.

Figure 3:
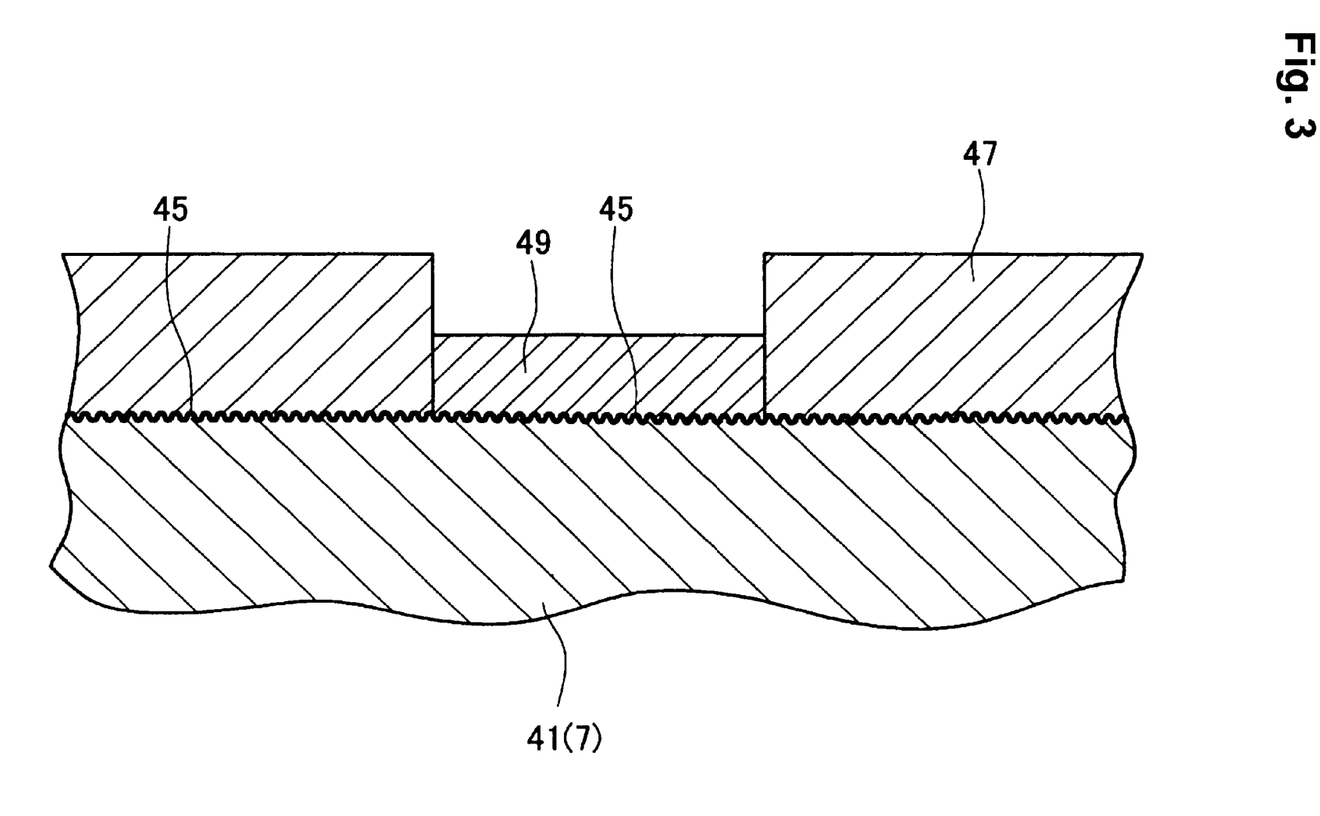
FIG. 3 is an explanatory view relating to the method for manufacturing the wiring substrate according to the embodiment, and showing the formation of a copper electroplating layer on an electroless copper plating layer exposed through a plating resist layer.

Next, in an electroless copper plating step, as represented by the bold line in FIG. 3, an electroless copper plating layer 45 having a thickness of about 0.70 μm is formed on the surface of the first resin dielectric layer 7 including portions corresponding to the through-holes 18.

Specifically, the substrate 41 is treated at about 65° C. for about 5 minutes with aminopolycarboxylic acid serving as an alkali conditioner. This treatment is performed in order to make the surface of the resin dielectric layer 7 uniform. Subsequently, the substrate 41 is washed with water. After that, the substrate 41 is treated at about 30° C. for about 1 minute with sodium persulfate and sulfuric acid. This treatment is performed in order to softly etch Cu exposed from the bottom of the through-holes 18 (the surface of the first conductor layer 27). Subsequently, the substrate 41 is washed again with water. After that, the substrate 41 is washed at about 30° C. for about 1 minute with 10% sulfuric acid. This treatment is performed in order to remove smut form the Cu surface exposed from the bottom of the through-holes 18 (the surface of the first conductor layer 27). The removal of smut means removal of oxide film and tarnish from the Cu surface. Subsequently, the substrate 41 is washed again with water. After that, the substrate 41 is treated at about 30° C. for about 2 minutes with sodium chloride. This treatment is performed in order to regulate the surface of the substrate 41. After that, the substrate 41 is subjected to catalyst treatment performed at about 25° C. for about 5 minutes with sodium chloride, stannous chloride, and palladium chloride. This treatment is performed to adsorb colloid particles (Pd/Sn) on the surface of the substrate. Subsequently, the substrate 41 is washed again with water. After that, the substrate 41 is treated at about 25° C. for about 8 minutes with borofluoric acid. This treatment is performed in order to remove a colloid surface layer (Sn). Subsequently, the substrate 41 is washed again with water. The substrate 41 is treated at about 45° C. for about 10 minutes with EDTA-2Na, copper sulfate, formaldehyde, and sodium hydroxide to thereby form the above-described electroless copper plating layer 45. At that time, Cu precipitates in the presence of a catalyst Pd. Subsequently, the substrate 41 is washed again with water.

Next, in a drying step, the substrate 41 on which the electroless copper plating layer 45 is formed is dried for 44 minutes while being maintained at a temperature of 80° C. by means of hot air. It is to be noted that the drying time may be shortened to about 33 minutes. In this step, the substrate 41 can be completely dried; however, since the heating temperature is relatively low, bonding strength between the first resin dielectric layer 7 and palladium 43 and that between the first resin dielectric layer 7 and the electroless copper plating layer 45 are not enhanced to a great extent.

Next, in a plating resist layer forming step, a plating resist layer 47 is formed in a predetermined pattern on the electroless copper plating layer 45 (see FIG. 3).

Specifically, the substrate 41 is pre-heated at about 80° C. Subsequently, a dry film (plating resist) covered with a protective PET film is applied onto the substrate 41 at about 110° C. at a speed of about 2 m/min. After that, the dry film is exposed to light with a mask having a predetermined pattern at an exposure of 100 mJ/cm$^2$ and an illumination intensity of 30 mW/cm$^2$. Subsequently, the PET is peeled off at a speed of about 1 m/min. After that, the dry film is treated at about 25° C. with Na$_2$CO$_3$ for the purpose of development. Finally, air is jetted to the substrate 41 to thereby dry the same.

Next, in a copper electroplating step, as shown in FIG. 3, the substrate 41 is subjected to copper electroplating, thereby forming the filled vias 19 (not shown) and a copper electroplating layer 49 on the electroless copper plating layer 45 formed on the first resin dielectric layer 7.

Specifically, the substrate 41 is treated at about 65□C. for about 5 minutes with an organic acid and 1% copper sulfate for the purpose of degreasing. This treatment is performed to remove the surface film. Subsequently, the substrate 41 is washed with water. After that, the substrate 41 is washed at 30° C. for about 1 minute with 10% sulfuric acid. This treatment is performed in order to remove smut form the Cu surface. Subsequently, the substrate 41 is washed again with water. After that, the substrate 41 is treated at about 22° C. for about 60 minutes with copper sulfate, sulfuric acid, chlorine, etc., in order to form the above-described copper electroplating layer 49. Then, the substrate 41 is washed again with water. Finally, the substrate 41 is dried at about 65° C. for about 9 minutes.

Figure 4:
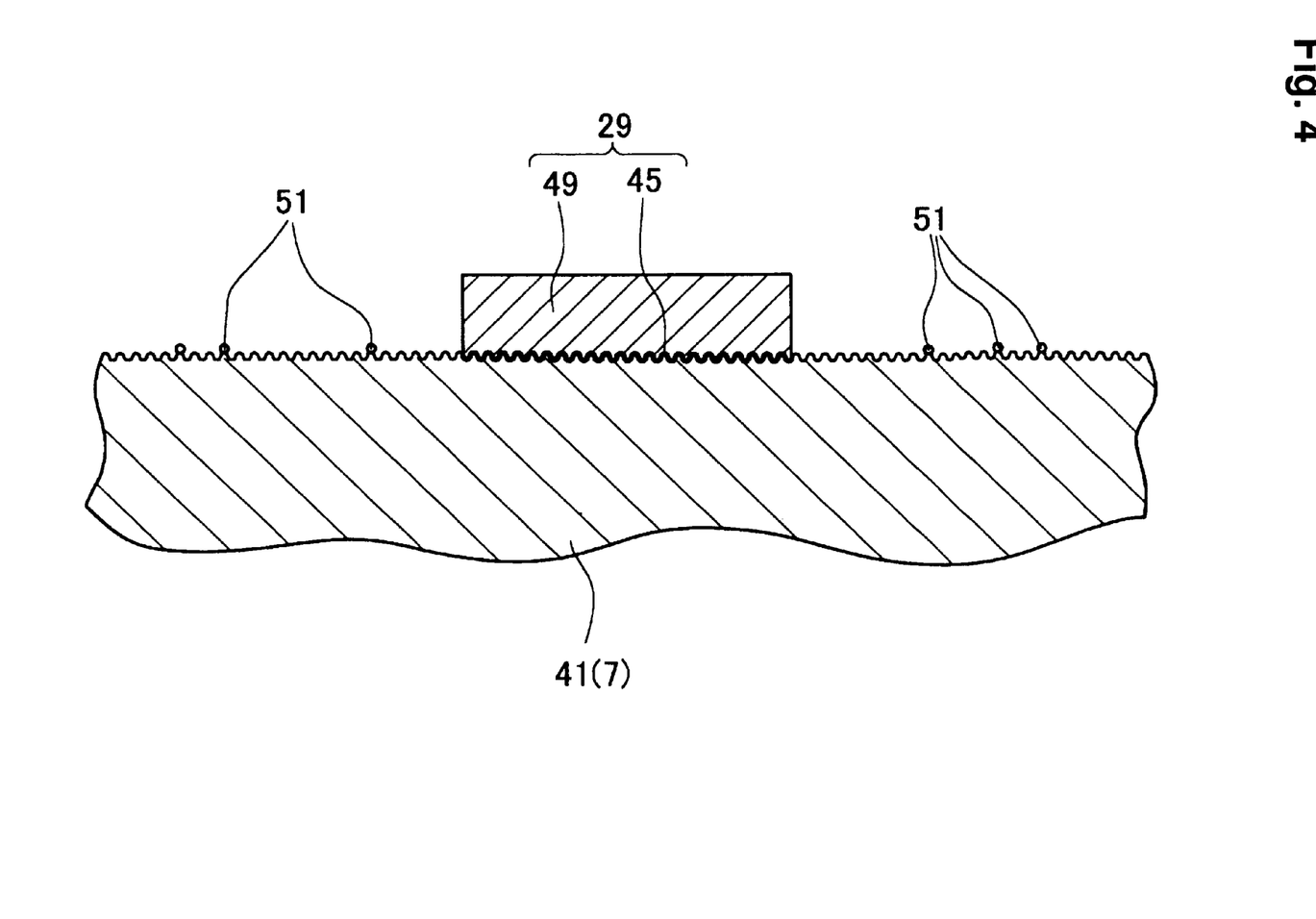
FIG. 4 is an explanatory view relating to the method for manufacturing the wiring substrate according to the embodiment, and showing the sate after etching-away of the electroless copper plating layer except where the same is overlaid with the copper electroplating layer.

Next, in a plating resist layer removing step, the plating resist layer 47 is removed (see FIG. 4).

Specifically, the substrate 41 is treated at about 50° C. for about 1 minute and 4o seconds by use of sodium hydroxide in order to remove the plating resist layer 47. Then, the substrate 41 is washed again by use of water. Finally, air is jetted to the substrate 41 to thereby dry the same.

Next, in an etching-away step, as shown in FIG. 4, the exposed electroless copper plating layer 45 (the electroless copper plating layer 45 except where the same is overlaid with the copper electroplating layer 49) is etched away, thereby forming the second conductor layer of a predetermined pattern.

Specifically, the substrate 41 is first treated at 25° C. for about 2 minutes with sodium persulfate and sulfuric acid in order to etch away the exposed electroless plating layer 45 on one side. Then, the substrate 41 is washed with water. After that, air is jetted to the substrate 41 to thereby dry the substrate 41. Subsequently, the substrate 41 is reversed and is treated again at 25° C. for about 2 minutes with sodium persulfate and sulfuric acid in order to etch away the exposed electroless plating layer 45 on the other side. Then, the substrate 41 is washed with water. After that, air is jetted to the substrate 41 to thereby dry the substrate 41.

In this case, a metallic residue 51 of palladium and copper may remain on an exposed portion of the first resin dielectric layer 7, which is exposed through the second conductor layer 29. However, since, in the course of working ranging from the palladium adhering step to the etching-away step, the substrate temperature is maintained at a relatively low temperature of not higher than about 85° C., bonding strength between the first resin dielectric layer 7 and palladium 43, and between the first resin dielectric layer 7 and the electroless copper plating layer 45 are not very high. Therefore, the electroless copper plating layer 45 and the palladium 43 tend to be readily etched away, and the amount of metallic residue 51 present on an exposed portion of the first resin dielectric layer 7 is smaller than that of a conventional method.

In the present embodiment, a span of working between the electroless copper plating step and the etching-away step; i.e., the electroless copper plating step, the drying step, the plating resist layer forming step, the copper electroplating step, the plating resist layer removing step, and the etching-away step, corresponds to the conductor layer forming step.

Next, in a cyan treatment step, the substrate 41 on which the second conductor layer 29 has been formed is cleaned at about 28° C. for 5 minutes with an aqueous solution of sodium cyanide (30 g/l), thereby completely removing the adhering metallic residue 51 of, for example, palladium and copper from an exposed portion of the first resin dielectric layer 7. In contrast to conventional permanganic acid treatment (see FIG. 6), the surface of the first resin dielectric layer 7 is not roughened (see FIG. 5).

Figure 5:
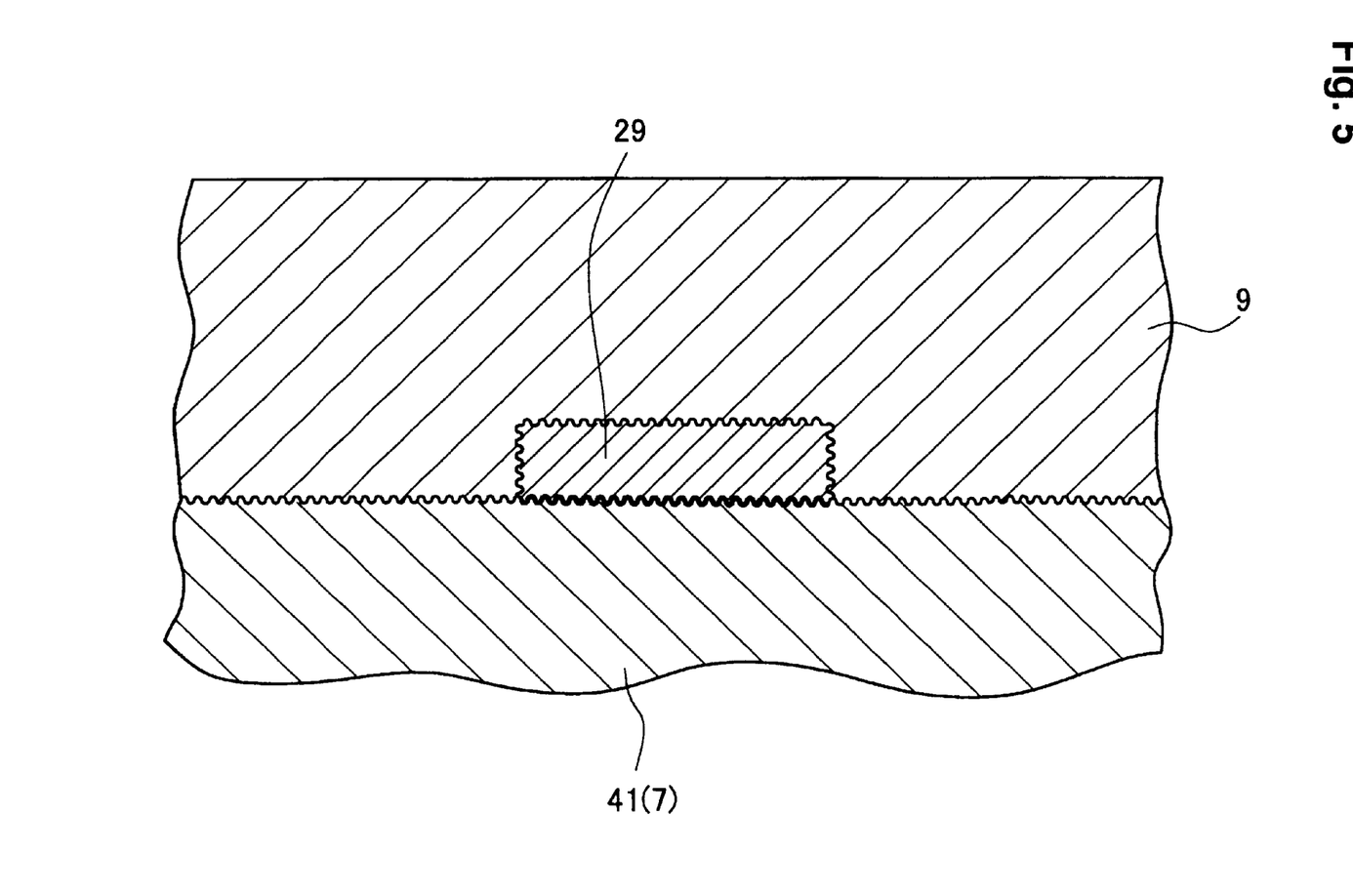
FIG. 5 is an explanatory view relating to the method for manufacturing the wiring substrate according to the embodiment, and showing the state after formation of a second resin dielectric layer.

Subsequently, the substrate 41 is dried at a substrate temperature of 65° C. for 22 minutes. Then, the substrate 41 is cleaned again at about 28° C. for 5 minutes with an aqueous solution of sodium cyanide (30 g/l). By cleaning the substrate 41 repeatedly with a cyanide-containing solution and an intermediate drying step, the adhering metallic residue 51 of palladium and copper can be more reliably removed as compared with the case where the substrate 41 is merely cleaned for a long period of time by use of the cyanide-containing solution. After the cyan treatment step, whether or not the metallic residue 51 is present can be readily checked by observing the exposed portion of the first resin dielectric layer 7 using a fluorescent microscope. Subsequently, the substrate 41 is washed again with water. Then, the substrate 41 is dried for about 22 minutes at 65° C. as measured at the substrate. Notably, the temperature for drying the substrate 41 may be increased to about 80° C.

In the present embodiment, any step in the course of working ranging from the palladium adhering step to the cyan treatment step is carried out while the substrate 41 is maintained at a relatively low temperature of not higher than about 85° C. Therefore, the metallic residue 51 remaining on an exposed portion of the first resin dielectric layer 7 does not strongly adhere to the first resin dielectric layer 7, and thus can be reliably removed in the cyan treatment step, thereby reliably preventing short circuits and reducing insulation resistance in relation to the second conductor layer 29.

Next, in a heat treatment step, the cyan-treated substrate 41 is heated at 150° C. for 120 minutes. Notably, this heat treatment may include, for example, heating at about 100° C. for about 30 minutes, subsequent heating at about 120° C. for about 30 minutes, and subsequent heating at about 150° C. for about 120 minutes. Thus, bonding between the first resin dielectric layer 7 and the electroless copper plating layer 45, which partially constitutes the second conductor layer 29, and bonding between the electroless copper plating layer 45 and the copper electroplating layer 49, which constitute the second conductor layer 29, are enhanced. Since this heat treatment is carried out after the cyan treatment step, the cyan treatment step can avoid encountering difficulty in removing the metallic residue 51 from an exposed portion of the first resin dielectric layer 7, which would otherwise result from heat treatment being carried out prior to the cyan treatment step.

Next, in a conductor roughening step, the surface of the second conductor layer 29 is roughened to a roughness Ra of about 0.40 μm through etching by use of an etchant containing formic acid (see FIG. 5), whereby bonding strength between the second conductor layer 29 and the second resin dielectric layer 9, which will be described below, can be enhanced.

Specifically, the substrate 41 is treated at about 35° C. with an etching solution containing formic acid to thereby roughen the surface of the second conductor layer 29. Subsequently, the substrate 41 is washed with water. After that, the substrate 41 is treated at about 25° C. with hydrochloric acid. This treatment is performed in order to remove smut. Subsequently, the substrate 41 is washed again with water.

According to the present embodiment, since the second conductor layer 29 is softened (modified) by the above-described heat treatment step, the surface of the second conductor layer 29 can be reliably roughened to a predetermined roughness by the conductor roughening step.

Subsequently, in a corrosion prevention step, the second conductor layer 29 is subjected to corrosion prevention treatment. Specifically, the substrate 41 is treated at about 25° C. with methanol to thereby form an organic film. Then, the substrate 41 is washed with water. After that, the substrate 41 is dried at about 86.5° C.

Next, in a second resin dielectric layer forming step (upper resin dielectric layer forming step), as shown in FIG. 5, the second resin dielectric layer 9 having through-holes 22 (not shown) formed therein for the formation of vias is formed on the first resin dielectric layer 7 and on the second conductor layer 29.

Specifically, a sheetlike uncured photosensitive epoxy resin or the like is placed thereon, followed by heat treatment for semi-curing the resin. Subsequently, the semi-cured resin dielectric layer is subjected to exposure with a mask of a predetermined pattern, followed by development. The developed resin dielectric layer is heated to cure the same, thereby forming the second resin dielectric layer 9 having through-holes 22 formed therein for the formation of vias.

Since the first resin dielectric layer 7 is surface-roughened to a predetermined roughness (Ra=about 0.45 μm), and the second conductor layer 29 is surface-roughened to a predetermined roughness (Ra=about 0.40 μm), bonding strength between the first resin dielectric layer 7 and the second resin dielectric layer 9, and between the second conductor layer 29 and the second resin dielectric layer 9, are enhanced.

Subsequently, according to the method for forming the second conductor layer 29 and the like on the first resin dielectric layer 7, the third conductor layer 31 and the like are formed on the second resin dielectric layer 9. Specifically, carried out sequentially are the resin roughening step, the palladium adhering step, the electroless copper plating step, the drying step, the plating resist layer forming step, the copper electroplating step, the plating resist layer removing step, the etching-away step, the cyan treatment step, the heat treatment step, the conductor roughening step, and the corrosion prevention step.

Subsequently, in a solder resist layer forming step (upper resin dielectric layer forming step), the solder resist layer 11 having openings 25 formed therein for exposure of pads is formed on the second resin dielectric layer 9 and on the third conductor layer 31.

Specifically, a semi-cured solder resist layer is formed on the second resin dielectric layer 9 and on the third conductor layer 31 and is then exposed with a mask in a predetermined pattern corresponding to the openings 25 for exposing the pads, followed by development. The developed solder resist layer is heated to cure the same, thereby forming the solder resist layer 11 having openings 25 formed therein exposing the pads.

The step of forming the third conductor layer 31 on the second resin dielectric layer 9 and the step of forming the solder resist layer 11 thereon are similar to the step of forming the second conductor layer 29 on the first resin dielectric layer 7 and the step of forming the second resin dielectric layer 9 thereon, and thus yield a similar effect.

After the solder resist layer 11 is formed, in an Ni—Au plating step, a nickel plating layer for preventing oxidation is formed on pads and the like exposed through the solder resist layer 11, and a gold plating layer is formed on the nickel plating layer.

Thus, the wiring substrate 1 shown in FIG. 1 is completed. Pins may be provided in a standing condition on the corresponding pads exposed through the solder resist layer 11; alternatively, solder bumps may be formed on the corresponding pads.

While the present invention has been described with reference to the above embodiment, the present invention is not limited thereto, but may be modified as appropriate without departing from the spirit or scope of the invention.

For example, according to the above-described embodiment, the conductor layer forming step includes the electroless copper plating step, the drying step, the plating resist layer forming step, the copper electroplating step, the plating resist layer removing step, and the etching-away step, thereby forming the second and third conductor layers 29 and 31. That is, a so-called semi-additive process is employed to form the second and third conductor layers 29 and 31.

However, another process; for example, a subtractive process, may be employed to form the second and third conductor layers 39 and 31. When a subtractive process is to be employed, the conductor layer forming step is specifically carried out in the following manner. After the electroless copper plating step and the drying step are carried out, the copper electroplating step is carried out. Subsequently, an etching resist layer is formed (etching resist layer forming step). A copper electroplating layer exposed through the etching resist layer and an electroless copper plating layer underlying the copper electroplating layer are etched away (etching-away step), thereby forming the second or third conductor layer 29 or 31. Subsequently, the etching resist layer is removed (etching resist layer removing step).

This application is based on Japanese Patent Application No. 20011-95110 filed Jun. 27, 2001, incorporated herein by reference in its entirety.

What is claimed is:

1. A method for manufacturing a wiring substrate including a resin dielectric layer, a conductor layer formed in a predetermined pattern on the resin dielectric layer, and an upper resin dielectric layer formed on the resin dielectric layer and on the conductor layer, comprising:
   a conductor layer forming step of forming the conductor layer, through electroless copper plating and copper electroplating, on the resin dielectric layer of the substrate, the resin dielectric layer having a surface which has been surface-roughened to a predetermined roughness and to which palladium adheres;
   a cyan treatment step of cleaning the substrate, on which the conductor layer has been formed, with a cyanide-containing solution; and
   an upper resin dielectric layer forming step of forming an upper resin dielectric layer on the resin dielectric layer and the conductor layer of the cyan-treated substrate.

2. The method for manufacturing a wiring substrate as claimed in claim 1, wherein, the cyan treatment step comprises cleaning the substrate a plurality of times with the cyanide-containing solution and drying the substrate between cleanings.

3. The method for manufacturing a wiring substrate as claimed in claim 1, which comprises maintaining the substrate at a temperature not higher than about 85° C. in the course of working ranging from the conductor layer forming step to the cyan treatment step.

4. The method for manufacturing a wiring substrate as claimed in claim 2, which comprises maintaining the substrate at a temperature not higher than about 85° C. in the course of working ranging from the conductor layer forming step to the cyan treatment step.

5. The method for manufacturing a wiring substrate as claimed in claim 1, which further comprises conducting a heat treatment step after the cyan treatment step and before the upper resin dielectric layer forming step, for heating the cyan-treated substrate to a temperature higher than about 85° C.

6. The method for manufacturing a wiring substrate as claimed in claim 5, which further comprises conducting a conductor roughening step after the heat treatment step and before the upper resin dielectric layer forming step, for roughening the surface of the conductor layer.

7. A method for manufacturing a wiring substrate including a resin dielectric layer, a conductor layer of a predetermined pattern formed on the resin dielectric layer, and an upper resin dielectric layer formed on the resin dielectric layer and on the conductor layer, comprising:
   an electroless copper plating step of forming an electroless copper plating layer, through electroless copper plating, on the resin dielectric layer of the substrate, the resin dielectric layer having a surface which has been surface-roughened to a predetermined roughness and to which palladium adheres;
   a drying step of drying the substrate on which the electroless copper plating layer has been formed, at a temperature not higher than about 85° C.;
   a plating resist layer forming step of forming, after the drying step, a plating resist layer of a predetermined pattern on the electroless copper plating layer;
   a copper electroplating step of forming a copper electroplating layer, through copper electroplating, on the electroless copper plating layer exposed through the plating resist layer;
   a plating resist layer removing step of removing, after the copper electroplating step, the plating resist layer;
   an etching-away step of etching away the electroless copper plating layer except where the same is overlaid with the copper electroplating layer, thereby forming the conductor layer;
   a cyan treatment step of cleaning the substrate, on which the conductor layer has been formed, using a cyanide-containing solution; and
   an upper resin dielectric layer forming step of forming an upper resin dielectric layer on the resin dielectric layer and the conductor layer of the cyan-treated substrate.

8. The method for manufacturing a wiring substrate as claimed in claim 7, wherein the cyan treatment step comprises cleaning the substrate a plurality of times using the cyanide-containing solution and drying the substrate between cleanings.

9. The method for manufacturing a wiring substrate as claimed in claim 7, which further comprises conducting a heat treatment step after the cyan treatment step and before the upper resin dielectric layer forming step, for heating the cyan-treated substrate to a temperature higher than about 85° C.

10. The method for manufacturing a wiring substrate as claimed in claim 8, which further comprises conducting a heat treatment step after the cyan treatment step and before the upper resin dielectric layer forming step, for heating the cyan-treated substrate to a temperature higher than about 85° C.

11. The method for manufacturing a wiring substrate as claimed in claim 9, which further comprises conducting a roughening step after the heat treatment step and before the upper resin dielectric layer forming step, for roughening the surface of the conductor layer.

* * * * *